United States Patent
Schenker et al.

(10) Patent No.: US 6,883,159 B2
(45) Date of Patent: Apr. 19, 2005

(54) PATTERNING SEMICONDUCTOR LAYERS USING PHASE SHIFTING AND ASSIST FEATURES

(75) Inventors: Richard Schenker, Portland, OR (US); Gary Allen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 329 days.

(21) Appl. No.: 10/102,024

(22) Filed: Mar. 19, 2002

(65) Prior Publication Data

US 2003/0178703 A1 Sep. 25, 2003

(51) Int. Cl.⁷ .......................... G06F 17/50; H01L 29/06
(52) U.S. Cl. ........................................ 716/21; 257/626
(58) Field of Search .................. 716/21, 19; 430/5, 430/322, 333; 250/492.22; 438/800; 257/626, 632, 638

(56) References Cited

U.S. PATENT DOCUMENTS

| | | |
|---|---|---|
| 5,229,230 A | 7/1993 | Kamon |
| 5,302,477 A | 4/1994 | Dao et al. |
| 2002/0001758 A1 * | 1/2002 | Petersen et al. ................ 430/5 |
| 2002/0015900 A1 * | 2/2002 | Petersen ......................... 430/5 |

FOREIGN PATENT DOCUMENTS

| | | |
|---|---|---|
| EP | 1 174 764 | 1/2002 |
| JP | 11-143047 | 5/1999 |

OTHER PUBLICATIONS

Peterson, John S. "Analytical Description of Anti–scattering and Scattering Bar Assist Features" Optical Micolithography XIII, vol. 4000. Society of Photo–Optical Instrumentation Engineers. 2000. <<http://www.advlitho.com/content/Papers/4000–08.pdf>>.*

Kroyan, A., et al., "Effects of Sub–Resolution Assist Features on Depth of Focus and Uniformity of Contact Windows for 193 nm Lithography", *Proc. of the SPIE*, vol. 3679, pt. 1–2, pp. 630–638 (1999).

* cited by examiner

*Primary Examiner*—Craig A. Thompson
(74) *Attorney, Agent, or Firm*—Fish & Richardson P.C.

(57) ABSTRACT

A photomask and method of patterning a photosensitive layer using a photomask, the photomask including a substrate and a film coupled to substrate. The film is etched with a phase shifted assist feature, a low aspect ratio assist feature or phase shifted low aspect primary features.

18 Claims, 4 Drawing Sheets

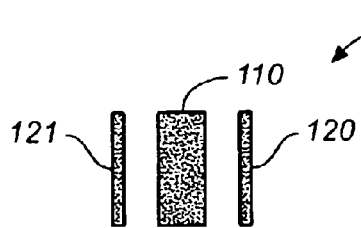
FIG._1
(PRIOR ART)
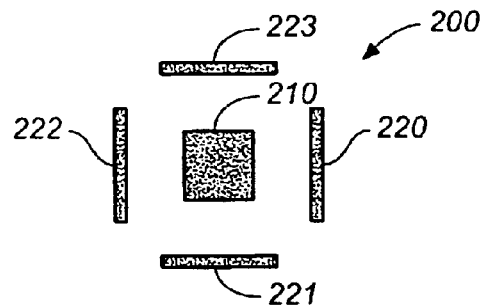
FIG._2
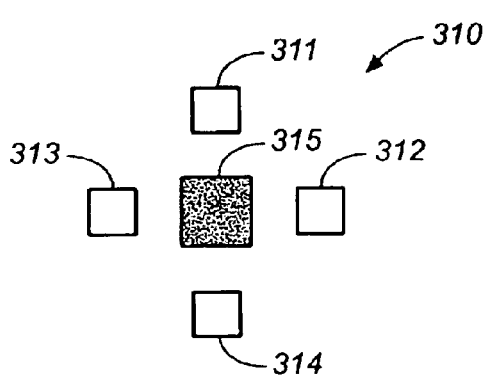
FIG._3a
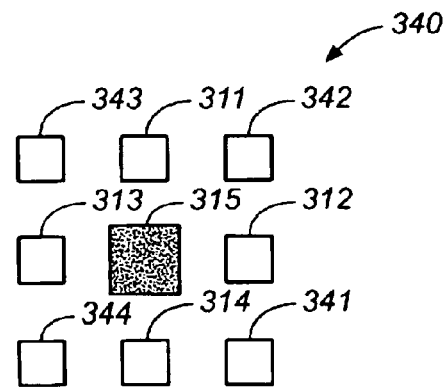
FIG._3b
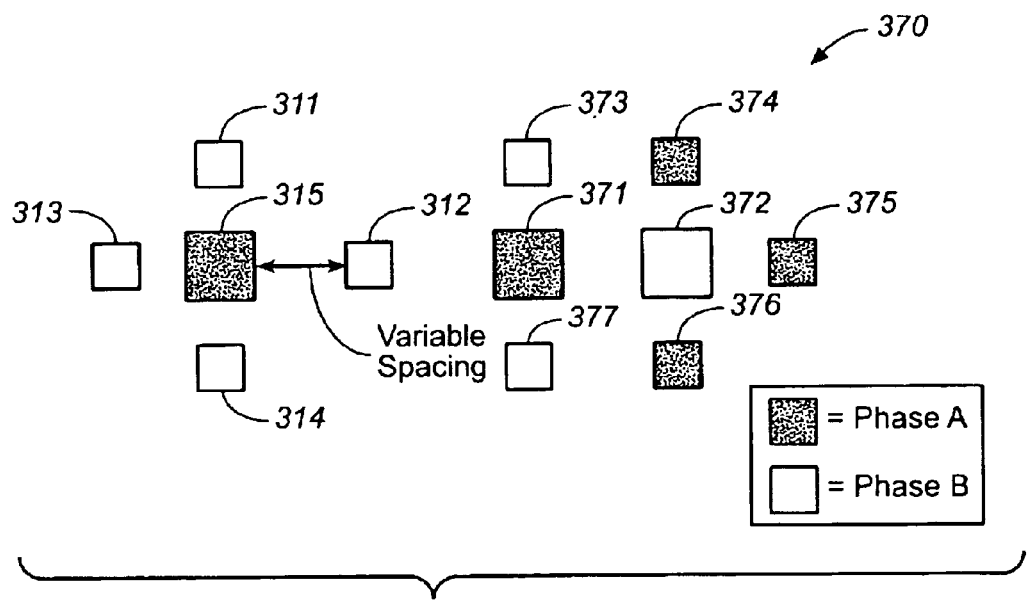
FIG._3c

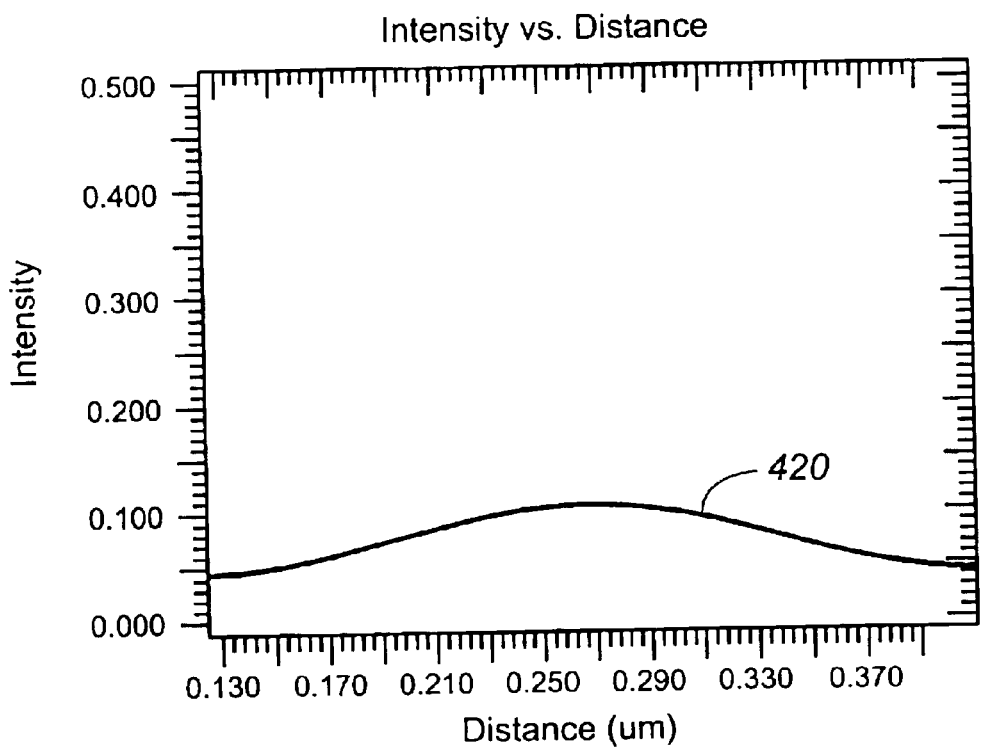
FIG._4a
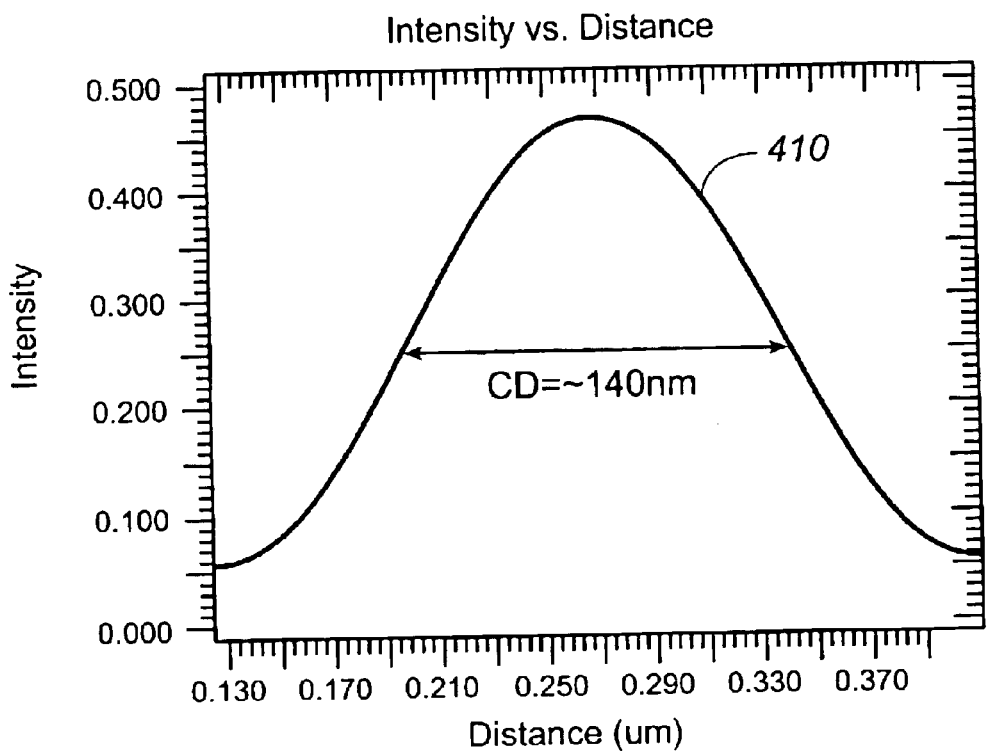
FIG._4b

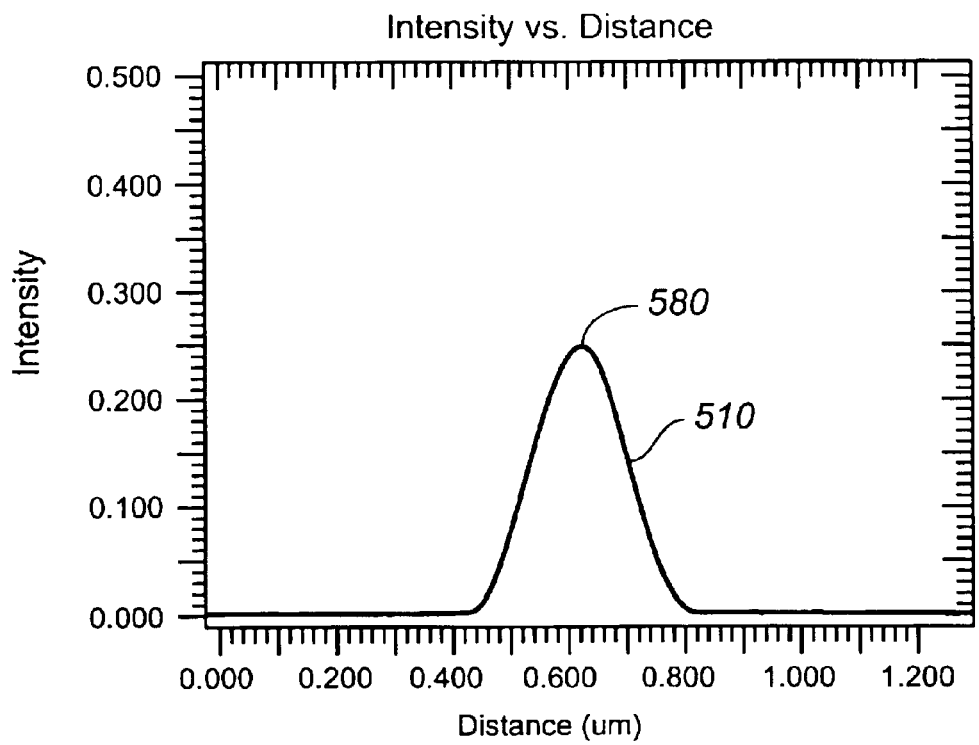
FIG._5a
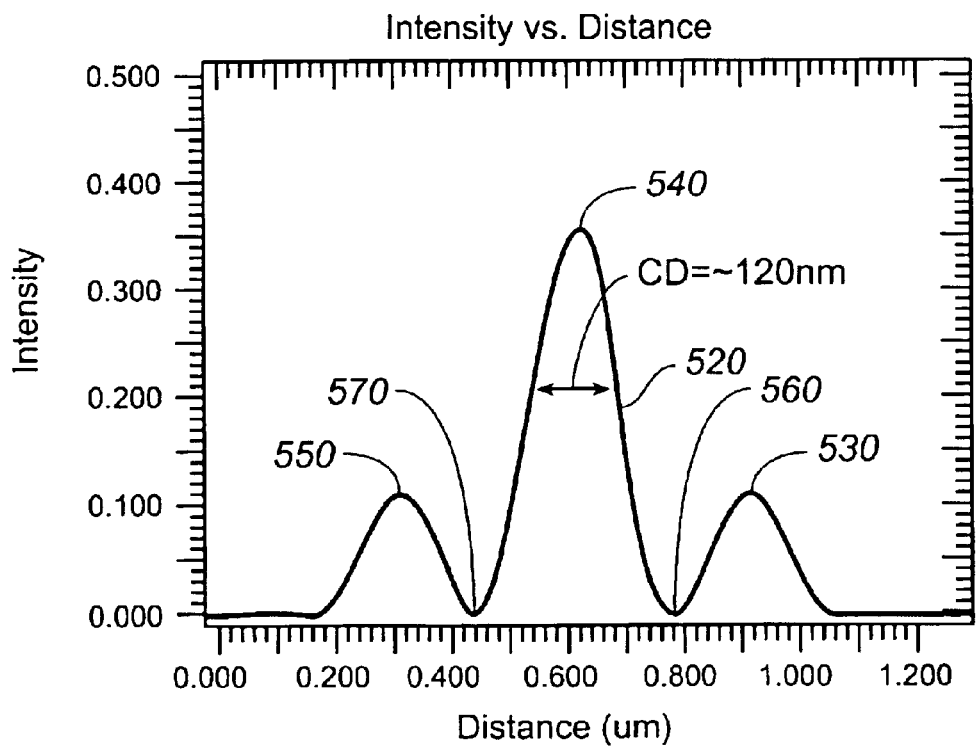
FIG._5b

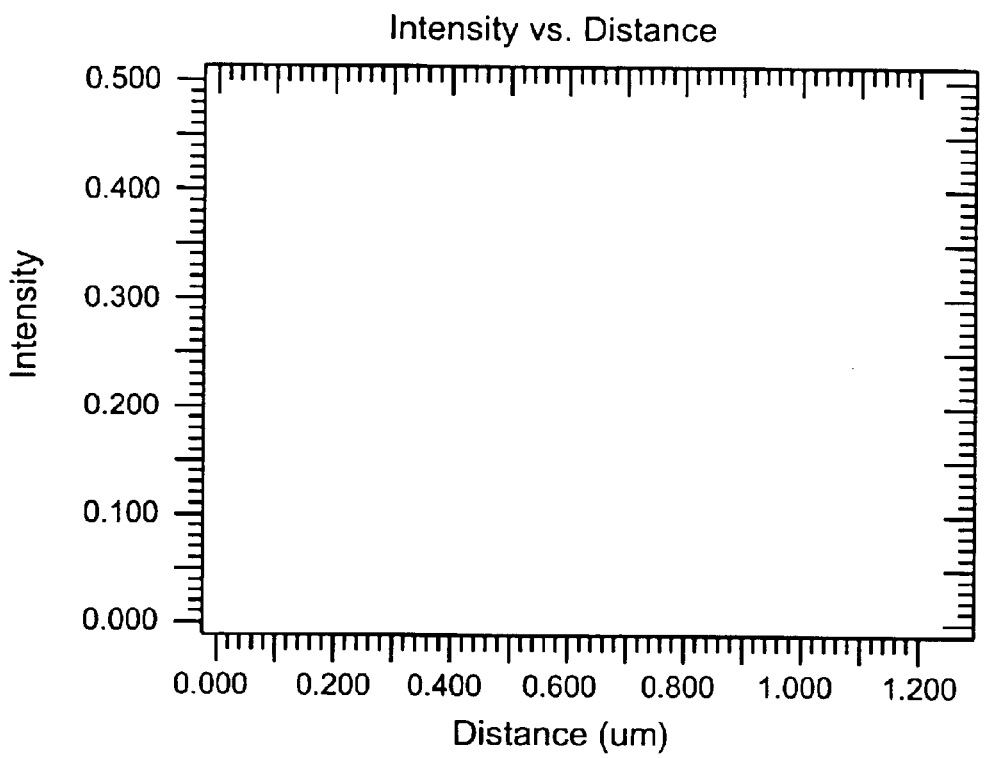
FIG._6a
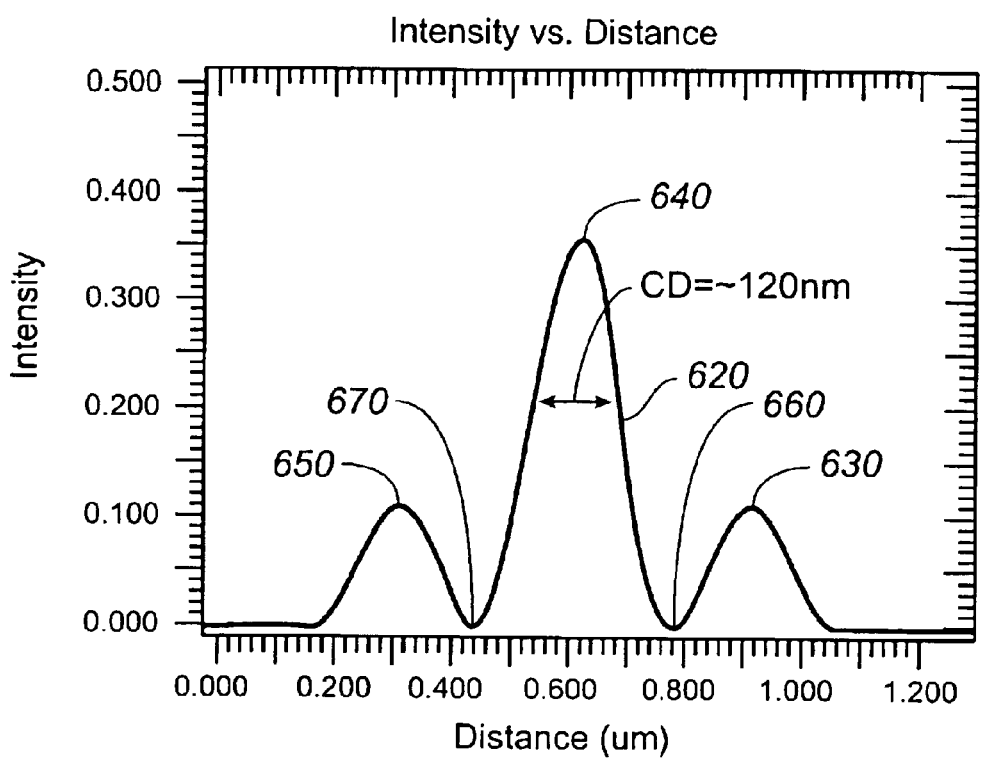
FIG._6b

PATTERNING SEMICONDUCTOR LAYERS USING PHASE SHIFTING AND ASSIST FEATURES

BACKGROUND

This description relates to patterning semiconductor layers using phase shifting and assist features.

Modern microelectronic devices are commonly produced using a lithographic process. In this process, a semiconductor wafer is coated with a layer of resist. This resist layer is then exposed to illuminating light by passing the light through a mask. The mask controls the amplitude of the light incident upon the wafer. The mask layer is subsequently developed, non-exposed resist is removed, and the exposed resist produces an image of the mask on the wafer.

Different masks are used for patterning the various layers of semiconductor devices. Some layers, such as the layers containing metal and transistors, require masks capable of patterning features with high aspect ratios, i.e., length to width ratios of greater than 2.5. These features are small in only one dimension. Other layers, such as contact and via layers, require masks operable to pattern features with low aspect ratios, i.e., length to width ratios of less than 2.5. These features are small in both dimensions.

Continued improvements in lithography have enabled the printing of increasingly finer features, allowing for smaller device dimensions and higher density devices. This has allowed the integrated circuit (IC) industry to produce more powerful and cost-effective semiconductor devices. As features, which are all smaller than the wavelength of the light used to transfer the pattern onto the wafer, become increasingly smaller, it becomes increasingly more difficult to accurately transfer the pattern onto the wafer.

To solve this problem, two separate techniques have been applied in the development of masks used to pattern layers with high aspect features—phase shifting and the use of assist features. Phase-shifted masks are masks that not only block light, but also selectively alter the phase of the light transmitted through the mask in order to improve the resolution of the features on the wafer. Under subwavelength conditions with closely spaced features, optical distortions as well as diffusion and loading effects of photosensitive resist and etch processes cause printed line edges to vary. By phase shifting the light incident on adjacent features such that certain open regions in the mask transmit substantially all the radiation incident thereon, and near or surrounding open regions transfer all of the radiation incident thereon, at a phase shift of approximately 180 degrees, the spillover of light between one feature and the next causes destructive interference providing a good contrast at the feature's edge. Using phase shifting, nested features can be moved more closely together and can still be accurately patterned.

Assist features, by contrast, are used to pattern isolated high aspect features. Assist features are reticle or mask features used to nest these otherwise isolated features in order to take advantage of photoresist and tools which are optimized to pattern nested features. Assist features are ideally designed such that they are small enough that they do not themselves transfer onto the wafer, but are large enough such that proximal features assume properties of nested features. Assist features also have the advantage of increasing the uniformity of the wafer by ensuring that all features are patterned as nested features.

DESCRIPTION OF DRAWINGS

FIG. 1 illustrates a prior art application of assist features in the context of high aspect primary features.

FIG. 2 illustrates the application of assist features to create low aspect primary features.

FIG. 3a illustrates the application of low aspect assist features to create low aspect primary features.

FIG. 3b illustrates an alternative application of low aspect assist features to create low aspect primary features.

FIG. 3c illustrates a second alternative application of low aspect assist features to create low aspect primary features.

FIGS. 4a, 4b, 5a, 5b, 6a, and 6b show mask image intensity curves.

DETAILED DESCRIPTION

Referring to FIG. 1, a prior art view of a portion of a mask 100 used to pattern a high aspect device layer is shown. As can be seen, a plurality of same phase features 110, 120 and 121 are present. Feature 110 is, for example, a primary feature (i.e., a feature intended to be patterned onto the wafer) used to pattern a high aspect metal or transistor layer. Features 120 and 121 are high aspect assist features used to nest feature 110 and to impart on feature 110 the same properties as other nested high aspect features on the mask 100. By ensuring that all primary features have the properties of nested features, as opposed to some features having nested features and some having isolated features, the wafer may be more uniformly patterned.

FIG. 2 illustrates the application of same phase assist features to pattern low aspect features, such as contacts and vias. Mask 200 includes low aspect primary feature 210, which may be a contact, and high aspect assist features 220–223. High aspect assist features 220–223 nest low aspect primary feature 210, imparting onto primary feature 210 the same properties as other nested low aspect features on mask 200. By using assist features to pattern low aspect features, a designer is able to improve isolated feature image quality and achieve uniformity advantages of the kind achievable in the context of using assist features to pattern high aspect features.

FIGS. 3a, 3b and 3c illustrate the application of phase-shifted low aspect assist features to pattern low aspect features, such as contacts and vias. As shown, masks 310, 340, and 370 comprise a plurality of Phase A (for example 180 degree) regions—features 315, 371, and 374–376—and a plurality of Phase B (for example 0 degree) regions—features 311–314, 341–344, 372, 373 and 377. Features 315, 371 and 372 are primary features such as contacts sought to be patterned onto the wafer. Features 311–314, 341–344, and 373–377 are assist features that may be used to nest features 315, 371 and 372 to give them the same properties as other nested features on the masks 310, 340 and 370. Assist features 311–314, 341–344, and 373–377 are ideally sized such that they are large enough to produce the necessary destructive interference but are small enough such that they do not produce a pattern on the wafer.

In FIGS. 3a, 3b and 3c, assist features are used to utilize the imaging advantages of alternative phase shift masks for the patterning of low aspect features such as contact and via layer patterning. The mask openings used to pattern closely spaced contacts transmit light one-half a wavelength (0 versus 180 degrees in this example) out of phase with respect to adjacent contacts. This phase shift can be realized using a number of widely known methods including etching the glass on the mask or applying a patterned transparent film to the substrate. As seen in FIGS. 3a and 3b, subresolution assist features (311–314 and 341–344) can be placed nearby isolated features on the mask (feature 315). Subresolution assist features are assist features that do not produce a feature on the wafer because the image does not transfer into the photoresist. Or, as seen in FIG. 3c, phase shifted assist features (for example feature 312) can also be placed at approximately equal distance from features with intermediately spaced separations (for example features 315 and 371).

The phase shifted assist features of FIGS. 3a, 3b and 3c can be created using a layout manipulation engine such as Hercules™ by Avant! Corporation of Fremont, Calif., or Calibre™ by Mentor Graphics Corporation of Wilsonville, Oreg. The assist feature sizing, separation and phase assignment constraints can be manipulated by user generated commands. The synthesized phase shift contact layout with phase shifted assist features can be further manipulated by rule or model-based optical proximity correction (OPC) tools, such a Proteus™ by Avant!. These tools manipulate the mask size of the contacts on a fine scale so that primary features with different nearby structures pattern with identical sizes on the wafer.

FIGS. 3a and 3b illustrate two alternative embodiments for using assist features to pattern feature 315. The introduction of assist features 311–314 on mask 310, and the introduction of assist features 311–314 and 341–344 on mask 340, not only allows feature 315 to take on the characteristics of a nested feature, but also enables the mask to utilize phase shifting to further define the boundaries of, and improve the image contrast of, the image of feature 315. By creating assist features 311–314 and 341–344 which are 180 degrees out of phase with the feature 315 sought to be patterned, the destructive interference created between the assist features 311–314 and 341–344 and the feature 315 will create a shaper boundary at the edges of, and will improve the image contrast of, feature 315. This effect is illustrated in FIGS. 5a and 5b, and the general effects of using phase shifting are illustrated in FIGS. 4a and 4b.

FIGS. 4a and 4b illustrate an attenuated phase shift mask image intensity curve and an alternative phase shift mask intensity curve, respectively, for 260 nm pitched contacts created using a wavelength of 193 nm and lens parameters of 0.6 NA and 0.8 and 0.3 sigma respectively.

FIGS. 4a and 4b provide simulation results for the patterning of a 140 nm nested contact. Intensity curves 410 and 420 show the intensity of radiation at the image plane as a function of distance in micrometers (um). As shown, the intensity achieved by using an alternating phase shift mask to form a primary feature such as a contact (intensity curve 410) results in a much shaper image than with using an attenuating phase shift mask (intensity curve 420). The slope of intensity cure 410 at approximately 0.190 nm and 0.340 nm illustrate the sharpness of the feature appearing on the wafer. Given the intensity between approximately 0.190 nm and 0.340 nm, a 140 nm contact may be accurately patterned. By contrast, the slope of intensity curve 420 at approximately 0.190 nm and 0.340 nm is much less, resulting in a duller image or more likely an unresolved feature.

FIGS. 5a and 5b illustrate the benefits of using phase shifted assist features to nest an isolated contact. FIGS. 5a and 5b illustrate an isolated contact image intensity curve and an isolated contact with phase shifted assist features image intensity curve, respectively, created using a wavelength of 193 nm and lens parameters of 0.6 NA and 0.3 sigma.

The contact is 140 nm wide on the mask while the assist features are 100 nm wide. The center-to-center spacing between the contact and the assist features is 260 nm. The light intensity at the surface of the wafer for the simulation whose results are displayed in FIG. 5b is closer to the desired intensity pattern than the light intensity of FIG. 5a. For the contact feature simulated, the intensity of the contact feature in FIG. 5a is only 0.25 (see peak 580), whereas the intensity of the same contact feature in FIG. 5b is over 0.35 (see peak 540). Additionally, the slope of the curve 520 is greater at the edges (distances of approximately 0.500 and 0.620 defining the 120 nm contact) than the slope of curve 510, indicating a sharper image. Ideally, the intensity created by the assist features, which is shown in FIG. 5b at peaks 530 and 550, is small enough that the assist features will not print on the wafer.

FIGS. 6a and 6b illustrate the benefits achieved by using phase shifted assist features (FIG. 6b) as opposed to using same phase assist features (FIG. 6a). FIGS. 6a and 6b illustrate an isolated contact with assist features image intensity curve and an isolated contact with phase shifted assist features image intensity curve, respectively, created using a wavelength of 193 nm and lens parameters of 0.6 NA and 0.3 sigma.

As with FIGS. 5a and 5b, the contact is 140 nm wide on the mask while the assist features are 100 nm wide. The center-to-center spacing between the contact and the assist features is 260 nm. Referring to FIGS. 5b and 6b, by using phase shifted assist features, the intensity of the contact is optimized (seen at peaks 540 and 640). Further, the phase shifting results in destructive interference between the contact feature (peaks 540 and 640) and the assist features (peaks 530, 550, 630 and 650). This destructive interference is seen as valleys in the intensity 560, 570, 660 and 670. Using closely spaced like-phase assist features does not improve the image, as seen in FIG. 6a. The boundaries between the closely spaced features can only be resolved by using phase shifting and achieving the definition provided by the destructive interference. Without phase shifting, the intensity may have poor contrast resulting in no patterning on the wafer.

As illustrated in FIG. 3c, features typically have minimum dimensions. In addition, the design rules include a minimum spacing requirement between any portion of the features. By using assist features with alternating phase shifts, the minimum distance between assist features and contacts may be lessened. Assist features may therefore be used to improve the image contrast of isolated contacts located too close to support same phase assist features.

FIG. 3c further illustrates the simultaneous use of alternating phase shifted primary features and phase shifted assist features. Alternating phase-shifted assist features are used only for those portions of the features 315, 371 and 372 that do not have adjacent primary features that can be phase shifted. For example, because primary features 371 and 372 are in close proximity, one can achieve the benefits of phase-shifting by shifting the phase of primary feature 371 with respect to primary feature 372. Because the primary features 371 and 372 are nested with respect to each other, there is no need to insert an assist feature between the two features. However, given that features 315 and 371 are relatively isolated with respect to each other, insertion of alternate phase assist feature 312 allows for one to realize the benefits of phase shifting. Phase shifted assist features 311, 313–314, and 373–377 are also placed on the isolated edges of the primary features 315, 371 and 372 to provide a sharper contrast at those edges.

Referring back to FIGS. 3a, 3b and 3c, the assist features 311–314, 341–344, and 373–377 used to sharpen the image of features 315, 371 and 372 are low aspect assist features and may be square or nearly square. By using assist features with a small aspect ratio, the minimum dimension of the assist feature can be larger than that of a high aspect assist feature while still not exposing an unwanted feature on the wafer. This holds true because the area of the assist feature determines whether the assist feature will be patterned onto the wafer. The ability to manufacture the mask is also improved when the assist feature minimum dimension is prevented from becoming excessively small as the assist feature is the smallest feature on the mask to be fabricated and inspected. The size of the assist feature is generally chosen to be large enough to improve the primary feature patterning while small enough so as not to produce an unwanted feature on the wafer.

With regard to FIGS. 1, 2, and 3a–c, it will be appreciated that the features 110, 210, 315, 371 and 372 are for illustration purposes, and the device layer may have many different features and/or the features may have different configurations, depending upon the device layer being formed. It will further be appreciated that there will typically be many more features in other regions of the device layer not shown.

A number of embodiments of the invention have been described. Nevertheless, it will be understood that various modifications may be made without departing from the spirit and scope of the invention. For example, the use of phase shifted assist features can be applied as well to the creation of high aspect features. Accordingly, other embodiments are within the scope of the following claims.

What is claimed is:

1. A photomask comprising:
   a primary feature; and
   an assist feature located next to the primary feature, the assist feature phase shifted with respect to the primary feature and a minimum dimension of the assist feature being greater than half a minimum dimension of the primary feature.

2. A photomask comprising:
   a primary feature; and
   an assist feature located next to the primary feature, the assist feature phase shifted with respect to the primary feature and a minimum dimension of the assist feature being greater than or equal to two-thirds a minimum dimension of the primary feature.

3. A photomask comprising a low aspect ratio primary feature and a low aspect ratio assist feature located next to the primary feature, a low aspect ratio feature having an aspect ratio between 0.5 and 2.0.

4. The Photomask of claim 3 wherein the primary feature comprises a low aspect ratio primary feature.

5. A photomask comprising:
   a first low aspect ratio primary feature; and
   a second low aspect ratio primary feature located next to the first low aspect ratio primary feature, the first low aspect ratio primary feature phase shifted with respect to the second low aspect ratio primary feature, wherein a low aspect ratio feature has an aspect ratio between 0.5 and 2.0.

6. The photomask of claim 5 wherein the first low aspect ratio primary feature is located next to an assist feature, the assist feature phase shifted with respect to the first low aspect ratio primary feature.

7. The photomask of claim 5 wherein the first low aspect ratio primary feature is located next to a low aspect ratio assist feature, the low aspect ratio assist feature phase shifted with respect to the fist low aspect primary feature.

8. A photomask comprising:
   an alternating sequence of phase-shifted low aspect ratio features, wherein said sequence generally forms a line of low aspect ratio features, a low aspect ratio feature has an aspect ratio of about 1.0, said sequence comprises at least one assist feature, and said sequence comprises:
   a first low aspect ratio feature; and
   a second low aspect ratio feature, the second low aspect ratio feature located next to the first low aspect ratio feature, the first low aspect ratio feature phase shifted with respect to the second low aspect ratio feature.

9. The photomask of claim 8, the first low aspect ratio feature phase shifted approximately 180 degrees relative to the second low aspect ratio feature.

10. The photomask of claim 8 comprising a film patterned to define the phase shift between the first and second low aspect ratio features.

11. The photomask of claim 8 comprising a substrate etched to define the phase shift between the first and second low aspect ratio features.

12. The photomask of claim 8, wherein the assist feature has a transmission of greater than 0.5.

13. The photomask of claim 8, wherein a minimum dimension of the first low aspect ratio feature is greater than half a minimum dimension of the second low aspect ratio feature.

14. The photomask of claim 8, wherein a minimum dimension of the first low aspect ratio feature is greater than or equal to two-thirds a minimum dimension of the second low aspect ratio feature.

15. The photomask of claim 8, wherein the first low aspect ratio feature is a primary feature.

16. The photomask of claim 8, wherein the second low aspect ratio feature is a primary feature.

17. The photomask of claim 8, wherein the first low aspect ratio feature is an assist feature.

18. The photomask of claim 8, wherein the second low aspect ratio feature is an assist feature.

* * * * *